(12) United States Patent
Guenther

(10) Patent No.: US 9,754,669 B2
(45) Date of Patent: Sep. 5, 2017

(54) FLASH MEMORY ARRANGEMENT WITH A COMMON READ-WRITE CIRCUIT SHARED BY PARTIAL MATRICES OF A MEMORY COLUMN

(71) Applicant: Anvo-Systems Dresden GmbH, Dresden (DE)

(72) Inventor: Stefan Guenther, Dresden (DE)

(73) Assignee: ANVO-SYSTEMS DRESDEN GMBH, Dresden (DE)

( * ) Notice: Subject to any disclaimer, the term of this patent is extended or adjusted under 35 U.S.C. 154(b) by 0 days.

(21) Appl. No.: 14/871,093

(22) Filed: Sep. 30, 2015

(65) Prior Publication Data

US 2016/0093385 A1    Mar. 31, 2016

(30) Foreign Application Priority Data

Sep. 30, 2014    (DE) .................. 10 2014 114 257

(51) Int. Cl.
    *G11C 16/10*    (2006.01)
    *G11C 16/08*    (2006.01)
    (Continued)

(52) U.S. Cl.
    CPC .......... *G11C 16/10* (2013.01); *G11C 16/0433* (2013.01); *G11C 16/08* (2013.01);
    (Continued)

(58) Field of Classification Search
    CPC ......... G11C 16/10; G11C 16/24; G11C 16/26; G11C 16/08
    See application file for complete search history.

(56) References Cited

U.S. PATENT DOCUMENTS

| 4,380,804 A | 4/1983 | Lockwood et al. |
| 5,790,455 A * | 8/1998 | Caywood ............. H01L 27/115 257/E27.103 |

(Continued)

FOREIGN PATENT DOCUMENTS

| EP | 0778623 A2 | 6/1997 |
| WO | 03/036651 A2 | 5/2003 |
| WO | 2011/005665 A1 | 1/2011 |

OTHER PUBLICATIONS

Search Report issued for European Patent Application No. 15187698.4 dated Dec. 10, 2015.

*Primary Examiner* — J. H. Hur
(74) *Attorney, Agent, or Firm* — Heslin Rothenberg Farley & Mesiti P.C.

(57) ABSTRACT

A flash memory arrangement includes first memory cells for non-volatile memory of information and a read-write circuit. The read-write circuit includes a write latch, read amplifier, bit circuit pre-charge circuit, and databus interface, with the first memory cell being connected to a first bit circuit, word circuit, VSE circuit, and a select circuit, and the read-write circuit being connected to a column decoder, databus, and a read control signal circuit. A first memory column is arranged such that in a first partial matrix the first memory cell is arranged, in which a first select transistor, a memory transistor, and a second select transistor are arranged between the first bit circuit and a discharge hub. The second select transistor can be controlled by a global, non address-decoded read-write select circuit. At every bit circuit, a reference memory cell is arranged. A second partial matrix is provided equivalent to the first partial matrix.

6 Claims, 4 Drawing Sheets

Figure 1:
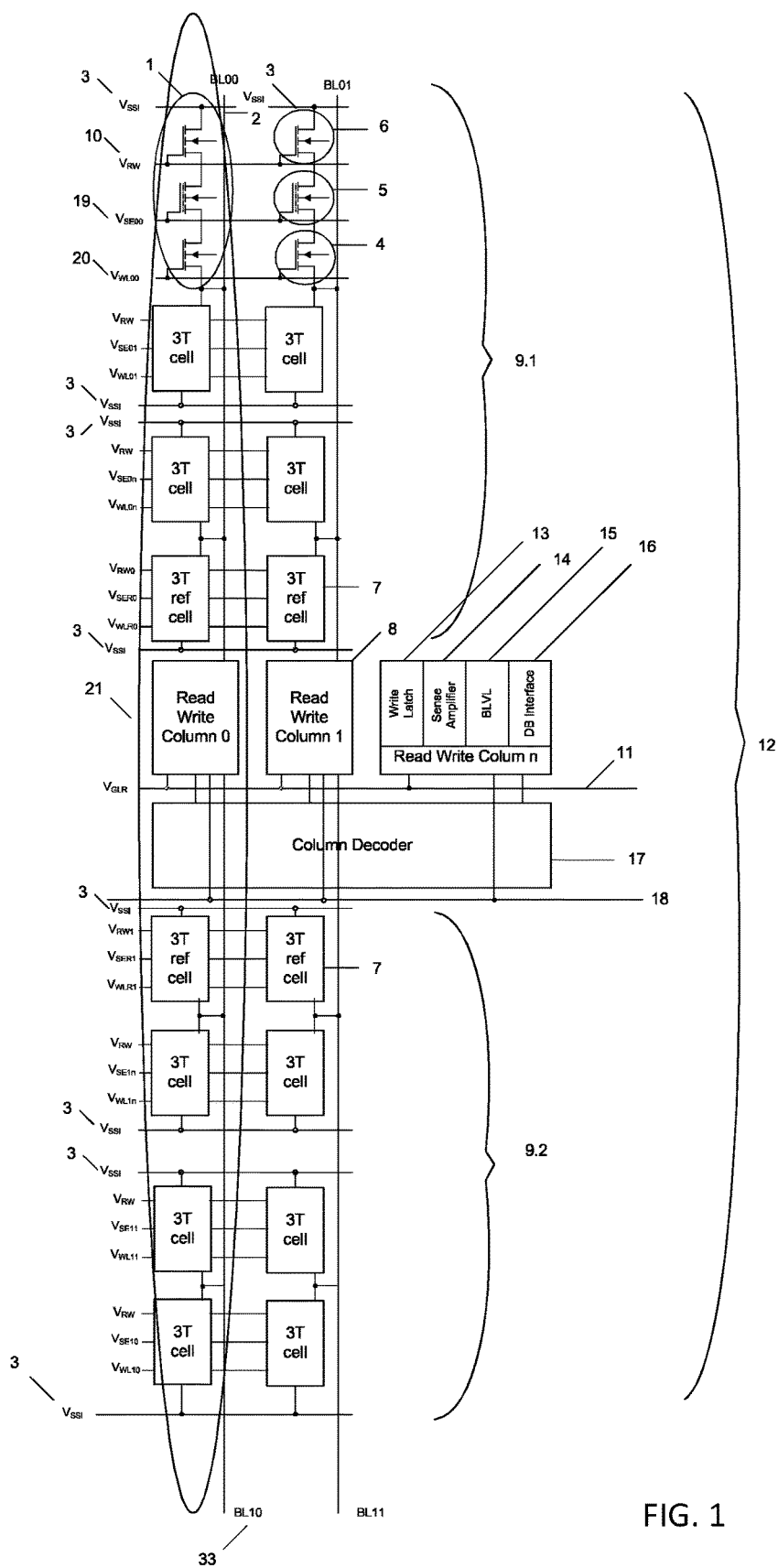

(51) Int. Cl.
*G11C 16/26* (2006.01)
*G11C 16/24* (2006.01)
*G11C 16/04* (2006.01)
*G11C 16/28* (2006.01)

(52) U.S. Cl.
CPC .............. *G11C 16/24* (2013.01); *G11C 16/26* (2013.01); *G11C 16/28* (2013.01)

(56) References Cited

U.S. PATENT DOCUMENTS

| | | | |
|---|---|---|---|
| 6,373,748 B2* | 4/2002 | Ikehashi | 365/185.22 |
| 6,862,223 B1* | 3/2005 | Lee | H01L 27/11524 |
| | | | 257/E27.103 |
| 7,099,200 B2* | 8/2006 | Sakui | G11O 5/025 |
| | | | 365/185.11 |
| 2001/0050377 A1* | 12/2001 | Ikehashi | G11C 16/3468 |
| | | | 257/200 |
| 2005/0218460 A1* | 10/2005 | Hasegawa | G11C 16/0433 |
| | | | 257/390 |
| 2006/0083064 A1* | 4/2006 | Edahiro | G11C 7/12 |
| | | | 365/185.17 |
| 2007/0019467 A1* | 1/2007 | Toda | G11C 11/5642 |
| | | | 365/185.2 |
| 2007/0091682 A1 | 4/2007 | Kang et al. | |
| 2008/0239825 A1 | 10/2008 | Yamada | |
| 2010/0208525 A1 | 8/2010 | Hanyu et al. | |

* cited by examiner

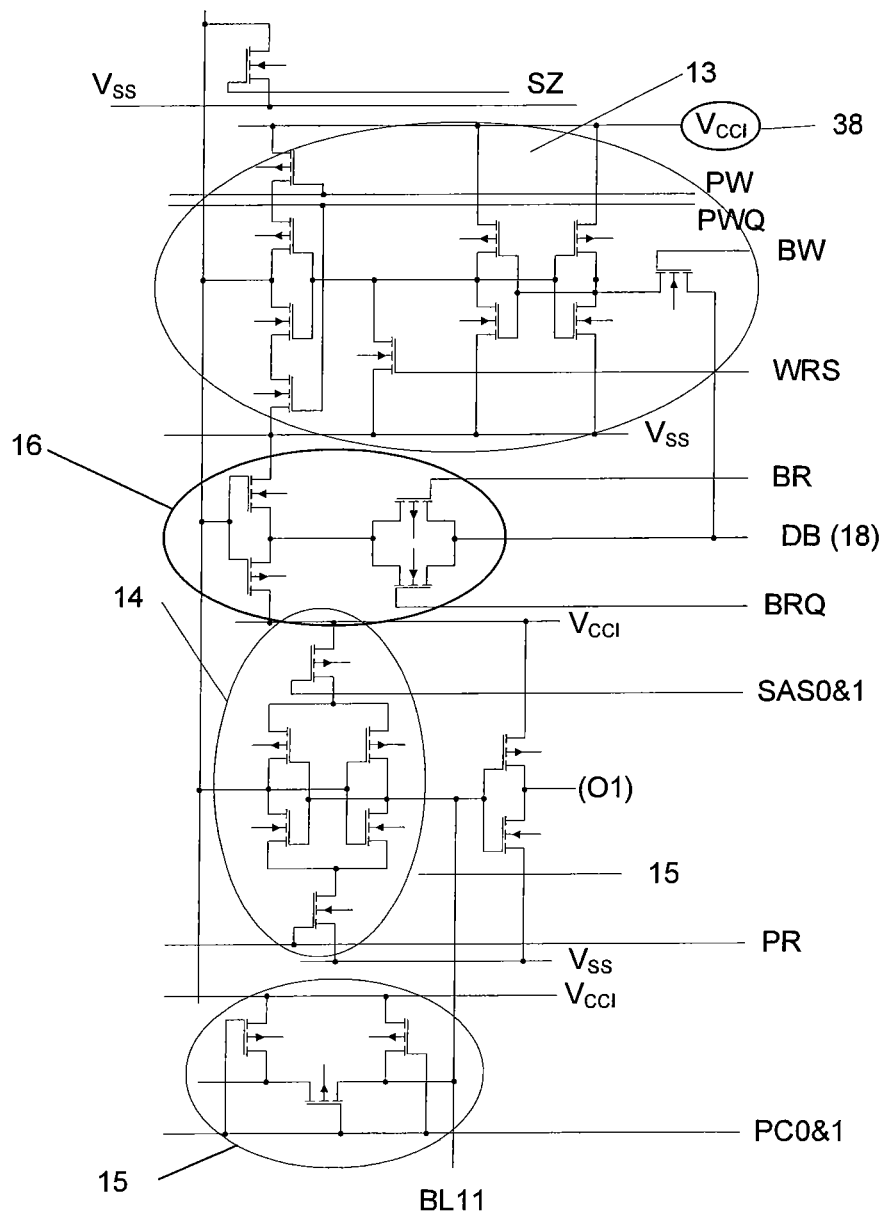

FLASH MEMORY ARRANGEMENT WITH A COMMON READ-WRITE CIRCUIT SHARED BY PARTIAL MATRICES OF A MEMORY COLUMN

BACKGROUND ART

The invention relates to a flash memory arrangement comprising a first memory cell for the non-volatile memory of information and a read-write circuit. The read-write circuit comprises a write latch, a read amplifier, a bit-circuit pre-charging circuit, and a databus interface. Here the first memory cell is connected to a first bit circuit, a word circuit, a VSE circuit, and a select circuit, and the read-write circuit to a column decode, a databus, and a read control signal circuit.

Here, the gate control circuit of the memory transistor is called the VSE circuit. As the only hub of the flash memory arrangement, it carries a "high level voltage," described in the following in the writing process on page 8 . . .

One and two-transistor cells are known, which require high voltages at drain and gate for generating hot electrons and storing them in the memory transistor.

Additionally, two-transistor cells are known which operate in a voltage-controlled fashion, in which high voltages on the bit circuits must be generated and decoded, with here not all bit circuits and/or every pair of bit circuits comprising a separate read amplifier.

The principle of a read amplifier and its arrangement in the array are known from WO 03/036651.

The information from the bit circuit is forwarded with information from the column decoder to a pre-amplifier, and only then amplified in the read amplifier, with the reference path with the reference cell and the reference pre-amplifier not being a part of the flash array.

A NOR-flash array with a high-voltage program buffer memory and a low-speed page read amplifier and input signals for the read amplifier controlled by a low voltage y-decoder is known from WO 2011/005665. Here, the programing and thus the decoding occurs with high voltages on the bit circuits and select circuits up to 8V.

The disadvantages of prior art are given in that the known solutions in the read-write path operate with voltages ranging from 5 to 8V, here called high voltage, which requires appropriately large transistors and thus larger chip areas, increased decoding expense, and slower access times. This also leads to limitations for the range of operating voltages and temperatures.

The invention is based on the objective to overcome the disadvantages of prior art.

BRIEF SUMMARY OF THE INVENTION

The objective is attained by a flash memory arrangement of the type mentioned at the outset, in which a first memory column is arranged such that the first memory cell is arranged in a first partial matrix of a flash matrix, with a first select transistor, a memory transistor, and a second select transistor being arranged between the first bit circuit and a discharge hub. The second select transistor is connected to a select circuit and can be controlled thereby with a global read-write signal, which is not address decoded. Accordingly, one reference memory cell is arranged at every bit circuit. Furthermore, a second partial matrix of the type of the first partial matrix is provided. The read-write circuit is connected to the two bit circuits of the two partial matrices. The read-write circuit is connected to a read control signal circuit and can be controlled thereby via a global read control signal.

On the one side, the first select transistor and on the other side the discharge hub of the second select transistor are arranged in the memory cell, i.e. the flash cell, between the memory transistor comprising non-volatile information and the bit circuit. Here, the first select transistor selects the word circuit to be written and the second select transistor selects globally the read or write function.

The discharge hub can, for example, be realized by supply voltage, ground, or a low-voltage power supply, as described in the following.

The partial matrix includes, in addition to at least one word circuit, a reference word circuit.

The memory column of a flash matrix is embodied such that every read-write circuit is always connected to two bit circuits, each allocated to different partial matrices. Each of these identical pairs of bit circuits comprises precisely one read-write circuit with one write latch, one read amplifier, one databus interface, and one pre-charged circuit.

The read-write circuit is furthermore connected both to at least one global read control signal circuit as well as column-decoded signal circuits.

It is possible that at least one second memory column is allocated like the first memory column with two additional bit circuits, extending over the first and the second partial matrix. This way a matrix is realized in which at least two matching memory cells of the respective memory column at a word circuit form a cell.

It is also possible that each of the bit circuits connected to the same read-write circuit is provided with several memory cells like the first memory cell. This way, several lines of a flash matrix may be formed. The number of lines depends on the number of memory cells at the bit circuit and the number of memory cells per line depends on the number of memory columns.

One embodiment provides that each of the bit circuits of the first partial matrix and its corresponding bit circuit of the second partial matrix are each connected to an identical number of memory cells like the memory cell.

It is also possible that the flash memory arrangement with all transistors of the read-write circuit, the column decoder, as well as all memory cells, except for the VSE circuit, are provided in a low-voltage domain. This way the matrix is part of the low-voltage domain, i.e. no high voltage is given at the read-write circuit or the supply voltage of the memory cells. Here, high voltage is understood as voltage ranging from 5 to 8V. The voltages in the low-voltage domain are clearly below that, for example ranging from 1 to 2V. The low supply voltage of the low-voltage domain ensures the high packing density and short access times.

Another option consists of connecting the discharge hub to the array ground. This way the pre-loaded bit circuit can be discharged via the memory cell in case of a deleted status of the memory cell and in case of a programmed cell this discharge of the bit circuit occurs not at all or slower than the discharge of the other bit circuit of the pair of bit circuits at the read amplifier by the reference memory cell.

It is also possible that first memory cells are connected via a first discharge hub and via respectively one bit circuit to a first read-write circuit and second memory cells to a second discharge hub and respectively via a bit circuit to a second read-write circuit. The first read-write circuit can additionally be controlled by a first column decoder and the second read-write circuit by a second column decoder. The first and second memory cells are connected alternating to the first discharge hub and the second discharge hub. Here, all of these memory cells are designed like the memory cell.

With this separated control of neighboring bit circuits the access thereto can occur independent from each other, both logically as well as with regards to time, causing interferences of neighboring bit circuits to be minimized and thus the dynamic behavior to be improved, and prevention of interferences and reliability can be increased.

At the discharge hubs it is possible that the first discharge hub is connected to the second discharge hub. This way, all memory columns are connected to the very same discharge hub.

It is also possible that the first discharge hub and the second discharge hub are connected to the array voltage supply circuit.

BRIEF DESCRIPTION OF THE DRAWING FIGURES

In the following the invention will be explained in greater detail with reference to an exemplary embodiment. The accompanying drawings show FIG. 1 a flash memory arrangement according to the invention with two memory columns, FIG. 2 a read-write circuit of a memory column, a flash memory arrangement according to the invention with four memory columns, each switched alternating with two discharge hubs, FIG. 3 a flash memory arrangement for alternating switched discharge hubs, and FIG. 4 a read-write circuit of a memory column for alternating switched discharge hubs.

DETAILED DESCRIPTION

FIG. 1 shows a flash memory arrangement 12, comprising a first memory cell 1 for the non-volatile memory of information and a read-write circuit 8. The read-write circuit 8 comprises a write latch 13, a read amplifier 14, a bit circuit precharge circuit 15, and a databus interface 16. Here, the first memory cell 1, comprising a first select transistor 6, a non-volatile memory transistor 5, and a second select transistor 4, is connected to a first bit circuit 2 and a discharge hub 3 (VCCI), with the select transistor 6, controlled by the select circuit 10 and connected to the discharge hub 3 (VSSI), and the memory transistor 5, with the memory transistor 5 controlled by the VSE circuit 19 and further connected to the second select transistor 4 controlled by the word circuit 20, and with the read-write circuit 8 connected to the column decoder 17, a databus 18, and a read control signal circuit 11.

In the flash memory arrangement 12, a first memory column 21 is arranged such that the first memory cell 1 is arranged in a first partial matrix 9.1 of a flash memory arrangement 12. Here, between the first bit circuit 2 and a discharge hub 3, a first select transistor 6, a memory transistor 5, and a second select transistor 4 are arranged. The select transistor 6 is connected to a read-write signal circuit 10 and thereby can be controlled by a global read-write signal $V_{RW}$, which is not address decoded. A reference memory cell 7 is connected to the bit circuit BL00 or, according to an embodiment with several bit circuits, to every bit circuit (BL00 . . . BL0n). Furthermore, a second partial matrix 9.2 is provided like the first partial matrix 9.1. The read-write circuit 8 is connected to both bit circuits BL00; BL10 of the two partial matrices. The read-write circuit 8 is connected to the read control signal circuit 11 and thereby it can be controlled by a global read control signal $V_{GLW}$.

In the write mode, a memory cell 1 is addressed by applying a voltage to the word circuit 20 $V_{WL00}$ and via the circuit BL00. In the following, a "high-level voltage," for example, with the voltage range of approx. 10 Volt, is applied to the VSE circuit 19 $V_{SE00}$ and thus the conductivity of the central memory transistor 5, arranged between the first select transistor 4 and the second select transistor 6, is lastingly changed according to the bit circuit potential or unchanged and thus information is stored, low or high. The second select transistor 6 is switched non-conductive via its gate circuit 10. Thus the write process is concluded.

In the read mode, again the entire memory cell 1 is set to the read mode by a positive voltage at the select circuit 10 and an address selection is performed via the circuits 20 $V_{WL00}$ and 2 BL00. By a voltage applied to the VSE circuit 19 $V_{SE00}$, at the corresponding bit circuit BL00, the pre-charged potential is or is not discharged according to the stored information, for example with different speeds.

Here, the use of a reference memory cell 7 is required in order to determine if this bit circuit potential is equivalent to a logical zero or one. This reference memory cell is part of a partial matrix 9.2 and connected to an also pre-charged bit circuit BL10. The reference memory cell 7 of the partial matrix 9.2 is addressed for all memory cells of a bit circuit BL0n of the partial matrix 9.1.

By a comparison of the potentials of the above BL00 of the first partial matrix (9.1) and the lower bit circuit BL10 of the second partial matrix (9.2) it can be determined if a logical one or zero was included in the selected memory cell 1 of the first partial matrix 9.1.

Figure 2:
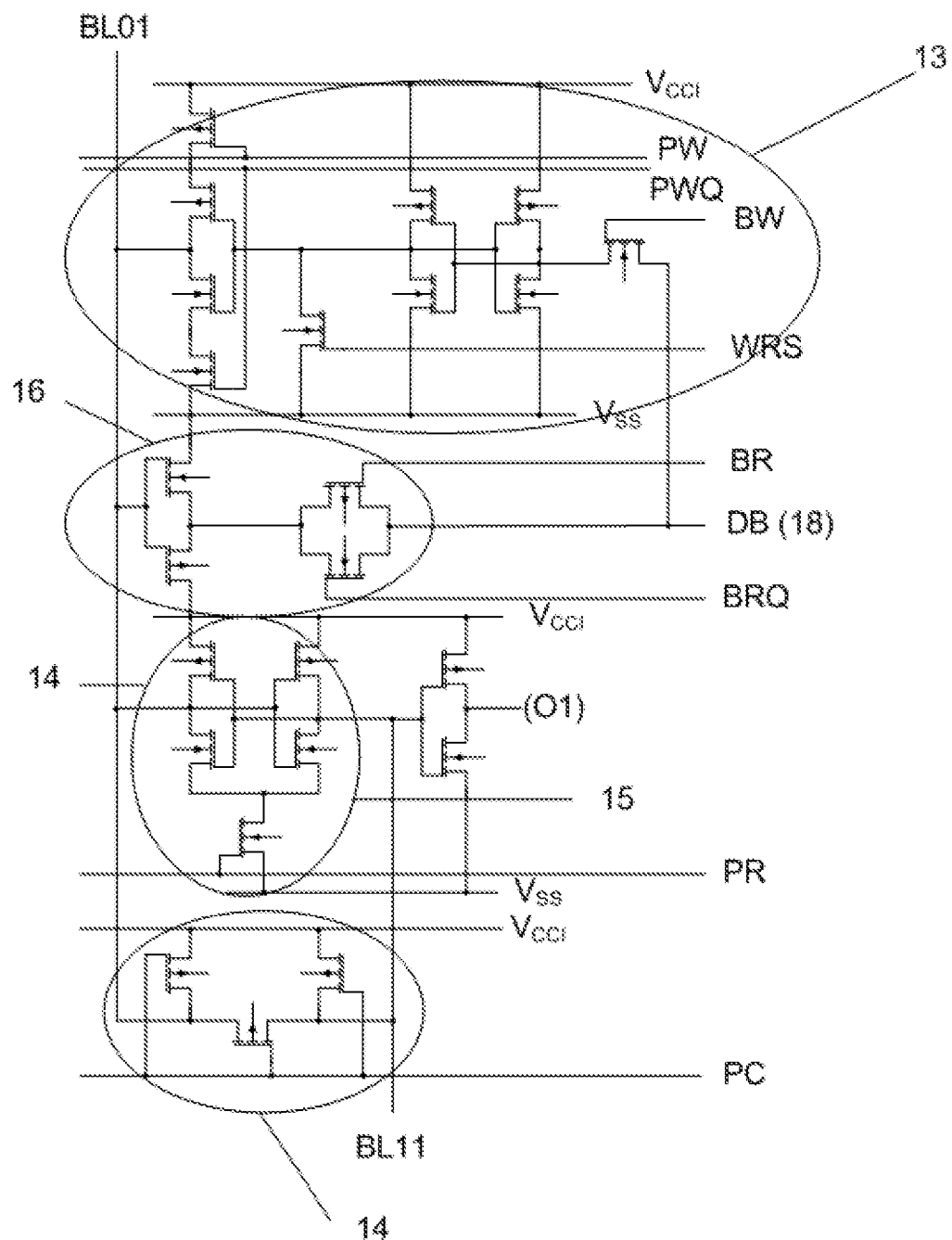

FIG. 2 shows a read-write circuit 8 in greater detail. For this purpose, in the following a functional description is provided.

In the write mode the data to be written is provided on the databus DB 18. The write latch 13 is reset via the control circuit WRS. Using the column-decoded signal BW=High the content is stored on the databus DB in the write latch 13.

This can occur sequentially for all columns of a matrix. This means the databus DB shows a certain width. According to this width, an appropriate bit count is written parallel in the write latches 14. When all bytes of a page to be written have been stored in the respective write latches 13, via the global PW and PWQ signals (page write/negated page write) the transfer of latched data occurs to the bit circuit BL01 and/or the inverted latched data via the read amplifier 14 to BL11, if writing is to occur in the second partial matrix 9.2.

This bit circuit information can be written in the upper partial matrix in the selected memory cell 1. If information is to be stored on the lower, second partial matrix 9.2, the read amplifier 14 is activated with the PR and in the alternating arrangement additionally with the SAS0&1 signal, and the inverted information of the bit circuit BL01 is rendered available on the bit circuit BL11. Here, it can be stored in the selected memory cell in a non-volatile fashion.

Required for writing at the necessary times, the signals BW=High, WRS=High, PW=Low and PWQ=High and BRQ=Low are necessary; for the partial matrix 9.2, additionally PR=High, and for the alternating arrangement additionally SAS0&1=Low.

In the read mode, it applies that BW=Low, WRS=Low, SAS0&1=Low, PW=High and PWQ=Low, so that the write-latch 4 is switched inactive. The read process is based on the pre-charged bit circuits BL01 and BL11, which was achieved by activating PC and/or PC0&1=Low of the pre-charged circuit 15. Accordingly, the bit charging pre-charged circuit 15 is deactivated via PC and/or PC0&1=High. A selective word circuit 20 (VWL0n) in the first partial matrix 9.1 and the reference word circuit VWLR1 in the second partial matrix 9.2 are activated simultaneously. According to the logical content of the selected memory cell 1 in the first partial matrix 9.1 the bit circuit BL01 is discharged faster or slower than the bit circuit BL11. Here, a difference signal develops between BL01 and BL11. Via PR=High the read amplifier 14 is activated and amplifies this difference signal. The information to the bit circuit BL01 is transferred via the databus interface 16 to the databus 18 DB.

If information is to be read from the second partial matrix 9.2, a word circuit VWL1n in the second partial matrix 9.2 and the reference word circuit VWLR0 in the first partial matrix 9.1 are selected. The read process occurs identically and the amplified information is available on the bit circuit BL11 and the inverted information on the bit circuit BL01. This information is transferred negated on the databus 18 via the databus interface 16.

Via a first control voltage applied to the connections $V_{RW0}$ and/or $V_{RW1}$ (all cells of a partial matrix) all cells 1 of a page can always be read in one reading process.

Figure 3:
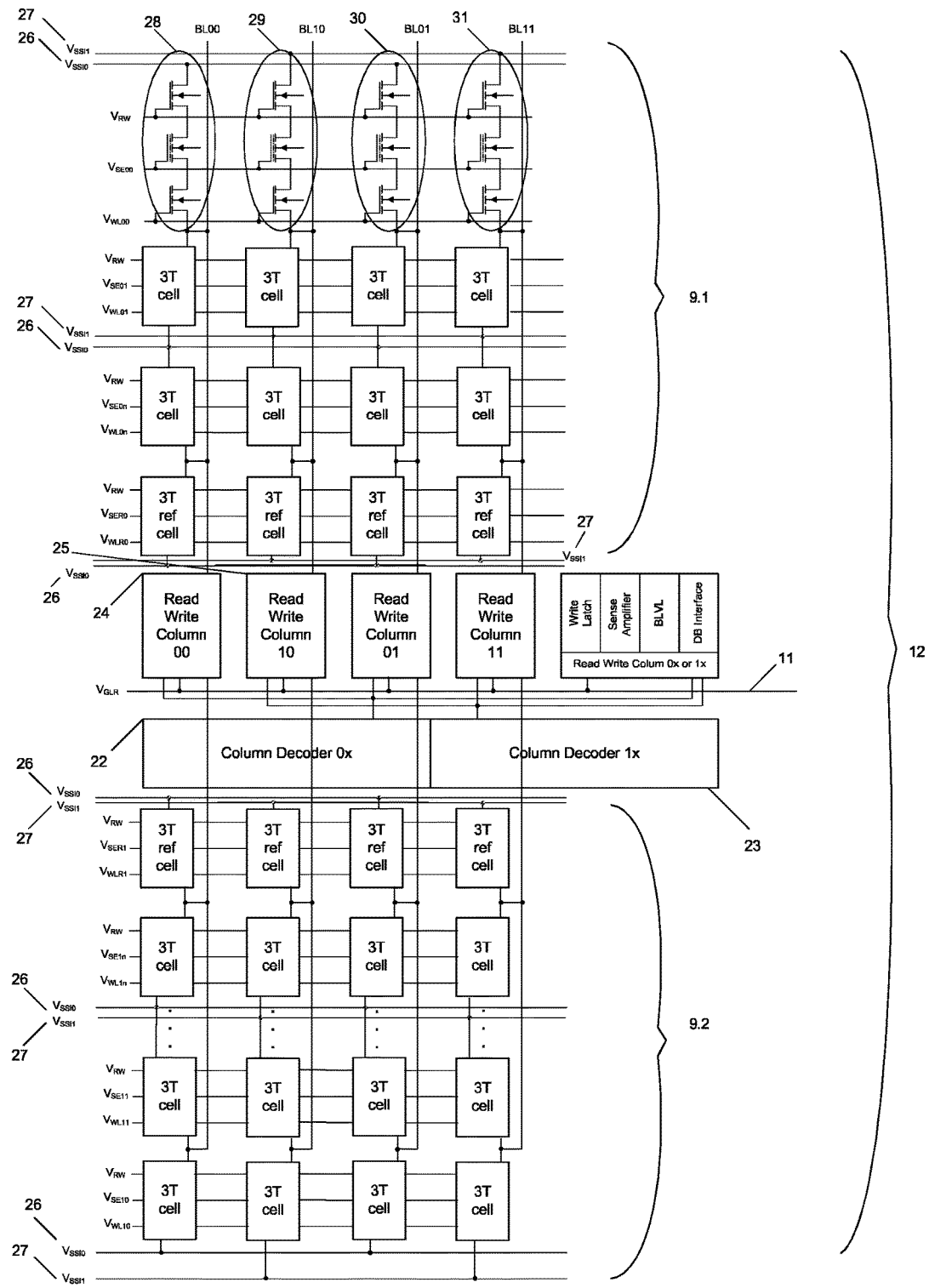

FIG. 3 shows a flash memory arrangement with four memory columns, each switched alternating with two discharge hubs and two column decoders. In this arrangement, always column-decoded non-selected cells are arranged on bit circuits BL1n between two selected cells on bit circuits BL0n, with the column-decoded non-selected bit circuits being not pre-charged and/or not discharged, because the pre-charging potential is identical to the discharge hub potential VSSI1. FIG. 4 shows the corresponding read-write circuit.

The advantages according to the invention include the following:
a) With the solution according to the invention in silicon (active) the flash memory arrangement 12 can only operate with the low-voltage domain, which allows all advantages of technological scaling, such as
   low power consumption
   low space requirement
   high speeds/short access times
   high parallelism
   availability of effective production techniques.
b) The high gate voltages required for the non-volatile memory is only required at one gate of the memory cell, which allows very small transistors in the memory array and thus the utilization of the advantages of scaling.
c) The on-pitch read-write circuit allows extremely short access times.
d) The reference cell concept according to the invention, waiving conventional reference power sources, allows the robustness of the solution.
e) With the design according to the invention the cross-talk of neighboring bit circuits is practically eliminated, which in turn increases safety from interferences.

The invention claimed is:

1. A flash memory arrangement for non-volatile memory comprising:
a first memory cell in a first memory column and a third memory cell in a third memory column connected to a first discharge hub and via respective first bit circuits to respective first read-write circuits;
a second memory cell in a second memory column and a fourth memory cell in a fourth memory column connected to a second discharge hub and via respective first bit circuits to respective second read-write circuits,
the first read-write circuits being controlled by a first column decoder and the second read-write circuits being controlled by a second column decoder;
the first memory cell and the third memory cell being connected to the first discharge hub and the second memory cell and the fourth memory cell being connected to the second discharge hub, alternatingly;
and each of the first and second read-write circuits comprising a write latch, a read amplifier, a bit circuit pre-charge circuit and a databus interface,
and each of the first, second, third and fourth memory cells being also connected to a word circuit, a gate control circuit and a select circuit,
and each of the first and second read-write circuits being also connected to a databus and a read control signal circuit,
wherein each of the first, second, third and fourth memory cells is arranged in a first partial matrix and comprises a first select transistor, a memory transistor and a second select transistor, with the second select transistor connected to the select circuit and controlled by a global, non-address-decoded read-write signal,
the first partial matrix further including a reference memory cell connected to each of the first bit circuits,
the flash memory arrangement further including a second partial matrix having a reference memory cell connected to each of second bit circuits,
and each of the first and second read-write circuits is connected to a respective one of the first bit circuits of the first partial matrix and to a respective one of the second bit circuits of the second partial matrix,
and a reference memory cell of the second partial matrix is addressed to determine if a logical one or zero is included, in a read mode, in each of the first, second, third and fourth memory cells,
and the first and second read-write circuits are controlled by a global read control signal supplied by the read control signal circuit.

2. The flash memory arrangement according to claim 1, wherein each of the first bit circuits of the first partial matrix and the second bit circuits of the second partial matrix is connected respectively to an identical number of reference memory cells.

3. The flash memory arrangement according to claim 1, wherein all transistors of the first and second read-write circuits, the first and second column decoders and the first, second, third and fourth memory cells exclusive of the gate control circuit are provided in a low-voltage domain.

4. The flash memory arrangement according to claim 1, wherein least one discharge hub is connected to an array ground.

5. The flash memory arrangement according to claim 1, wherein the first discharge hub is connected to the second discharge hub.

6. The flash memory arrangement according to claim 1, wherein the first discharge hub and the second discharge hub are connected to an array supply voltage circuit.

* * * * *